(12) United States Patent  (10) Patent No.: US 7,670,948 B2
Lee  (45) Date of Patent: Mar. 2, 2010

(54) SEMICONDUCTOR DEVICE HAVING DIFFUSION BARRIERS AND A METHOD OF PREVENTING DIFFUSION OF COPPER IN A METAL INTERCONNECTION OF A SEMICONDUCTOR DEVICE

(75) Inventor: Jae Suk Lee, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/559,724

(22) Filed: Nov. 14, 2006

(65) Prior Publication Data

US 2007/0111524 A1 May 17, 2007

(30) Foreign Application Priority Data

Nov. 15, 2005 (KR) .................. 10-2005-0109011

(51) Int. Cl.
*H01L 21/4763* (2006.01)
*H01L 23/48* (2006.01)
(52) U.S. Cl. ............... 438/639; 257/774; 257/E21.577; 257/E23.011
(58) Field of Classification Search ................. 257/734, 257/741, 750, 751, 753, 773, 774, E21.575, 257/E21.576, E21.577, E23.01, E23.011; 438/584, 597, 618, 622, 637, 638, 639, 640, 438/642, 650

See application file for complete search history.

(56) References Cited

U.S. PATENT DOCUMENTS

| | | | |
|---|---|---|---|
| 6,232,215 B1* | 5/2001 | Yang | 438/622 |
| 2001/0025976 A1* | 10/2001 | Lee | 257/296 |
| 2003/0222299 A1* | 12/2003 | Miura | 257/306 |
| 2003/0230809 A1* | 12/2003 | Nakajima et al. | 257/758 |
| 2004/0051117 A1* | 3/2004 | Chyan et al. | 257/200 |

FOREIGN PATENT DOCUMENTS

JP  2002353221  6/2002
KR  1020000008543  2/2000

* cited by examiner

*Primary Examiner*—Sue Purvis
*Assistant Examiner*—Kevin Quinto
(74) *Attorney, Agent, or Firm*—Sherr & Vaughn, PLLC

(57) ABSTRACT

Embodiments of a semiconductor device and a method of fabricating the same may include an insulating layer formed on a substrate and having a predetermined hole, a metal interconnection formed in the hole and protruding relative to the insulating layer, a first barrier extending in a lateral direction of the metal interconnection, a second barrier formed on the metal interconnection, and a metal pad formed on the second barrier.

25 Claims, 4 Drawing Sheets

SEMICONDUCTOR DEVICE HAVING DIFFUSION BARRIERS AND A METHOD OF PREVENTING DIFFUSION OF COPPER IN A METAL INTERCONNECTION OF A SEMICONDUCTOR DEVICE

The present application claims priority under 35 U.S.C. 119 and 35 U.S.C. 365 to Korean Patent Application No. 10-2005-0109011 (filed on Nov. 15, 2005), which is hereby incorporated by reference in its entirety.

BACKGROUND

Embodiments relate to a semiconductor device and a method of fabricating the same, that may prevent diffusion of copper contained in a copper interconnection.

As information media, such as computers, have become more extensively used, there has been steady development in the semiconductor industry. Semiconductor devices may operate at a high speed, have large storage capacities, and have the ability to process large amounts of information. Semiconductor manufacturing technology has developed to improve the degree of integration, reliability, speed, and responsiveness of such devices.

Regarding highly integrated semiconductor devices, studies and research are being conducted in relation to copper (Cu), which has been identified as a next-generation metal interconnection material for a multi-layered metal interconnection. A metal interconnection using copper may be suitable for improving operational speed and resistance characteristics of a semiconductor device and may have superior parasitic capacitance between metal interconnections. Copper, however, exhibits poor etching properties. Accordingly, a damascene process may be used to fabricate a metal interconnection using copper.

According to the damascene process, a via hole and a trench extending from the via hole may be formed in a flat interlayer insulating layer. Metal may then be filled in the via hole and the trench.

Such copper metal interconnection may be formed in a semiconductor device having a multi-layered structure. The semiconductor device may be electrically connected to a package through a bonding process. To this end, a bonding pad may be provided on the copper metal interconnection of the semiconductor device.

As illustrated in example FIG. 1, interlayer dielectric layer 11 may be formed on a semiconductor substrate (not shown). Interlayer dielectric layer 11 may be formed at a predetermined area thereof with a via hole. In addition, barrier metal 13 maybe formed in the via hole. Copper metal interconnection 15 may be formed on barrier metal 13 provided in the via hole.

Copper metal interconnection 15 may protrude relative to interlayer dielectric layer 11, and may prevent a short circuit between copper metal interconnection 15 and interlayer dielectric layer 11 that may occur due to a copper metal interconnection adhering to interlayer dielectric layer 11. Thus, stepped area A may exist between a surface of copper metal interconnection 15 and a surface of interlayer dielectric layer 11.

Diffusion barrier 17 and aluminum metal layer 10 may be formed on copper metal interconnection 15.

Copper (Cu) contained in copper metal interconnection 15 may diffuse in the lateral direction (for example, as shown by the arrows). Although diffusion barrier 17 may be formed in stepped area A, a structure of diffusion barrier 17 formed at a side portion of copper metal interconnection 15 may be weak. Hence, copper diffusion may occur in the lateral direction.

Copper of copper metal interconnection 15 may diffuse into the whole area of aluminum metal layer 10 by passing through diffusion barrier 17 in the lateral direction. Due to such copper diffusion, copper may exist in a grain boundary in aluminum metal layer 10. Accordingly, the quality of a bonding pad obtained from aluminum metal layer 10 may be degraded and bonding defects may occur during the bonding process.

SUMMARY

Embodiments relate to a semiconductor device and a method of fabricating the same, which may improve product quality by preventing diffusion of copper.

According to embodiments, a semiconductor device comprises an insulating layer formed on a substrate and having a predetermined hole, a metal interconnection formed in the hole and protruding relative to the insulating layer, a first barrier extending in a lateral direction of the metal interconnection, a second barrier formed on the metal interconnection, and a metal pad formed on the second barrier.

According to embodiments, a method of fabricating a semiconductor device comprises forming an insulating layer having a predetermined hole on a substrate, forming a metal interconnection in the hole such that the metal interconnection protrudes relative to the insulating layer, forming a first barrier on the substrate and patterning the first barrier such that the metal interconnection formed in the hole is exposed, and forming a second barrier and an aluminum metal layer on the substrate and patterning the second barrier and the aluminum metal layer, thereby forming a metal pad.

It is to be understood that both the foregoing general description and the following detailed description of embodiments are exemplary and explanatory, and are intended to provide further explanation of the claimed embodiments.

DETAILED DESCRIPTION OF EMBODIMENTS

Figure 1:
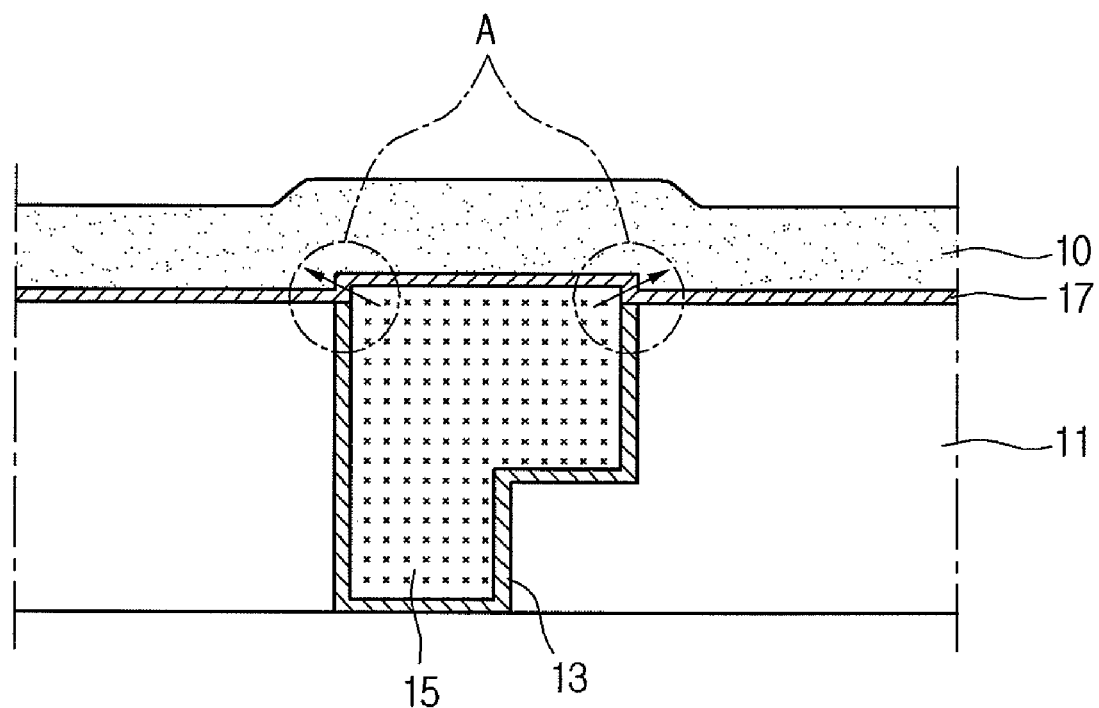
FIG. 1 is an example sectional view illustrating a process for forming a bonding pad on a copper metal interconnection in a semiconductor device.
Figure 2A:
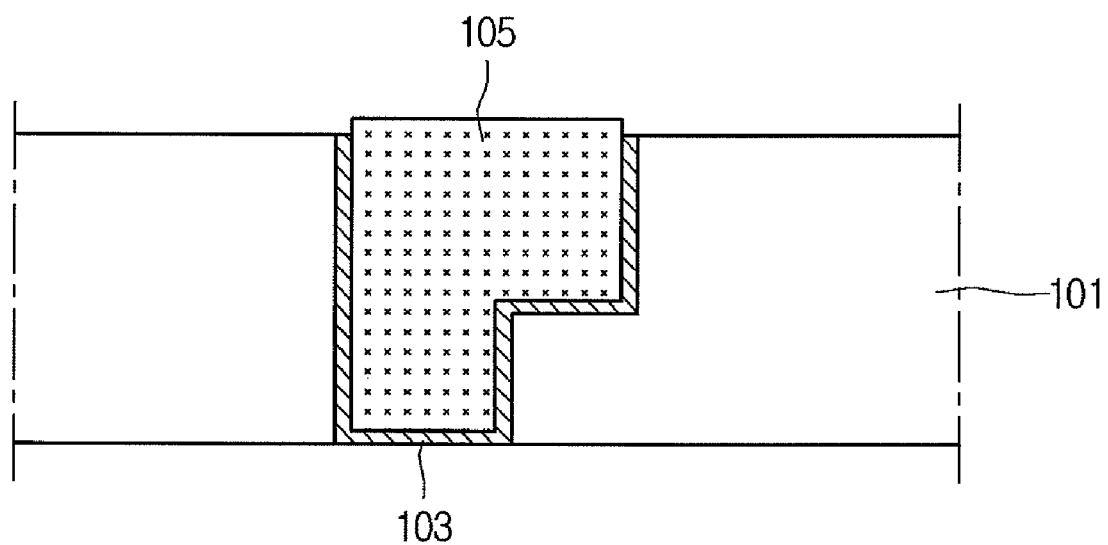
FIGS. 2A to 2G are example sectional views illustrating a semiconductor device and a procedure for fabricating a semiconductor device according to embodiments.

As illustrated in example FIG. 2A, interlayer dielectric layer 101 may be formed on a semiconductor substrate (not shown). Interlayer dielectric layer 101 may be formed by depositing a low-dielectric material on the semiconductor substrate (for example, through a PVD (physical vapor deposition) process, a CVD (chemical vapor deposition) process, a spin-on coating process, a PECVD (plasma enhanced chemical vapor deposition) process, an HDP (high density plasma) process, a CVD (chemical vapor deposition) process, or other known processes). Interlayer dielectric layer 101 may selectively use insulating materials, such as BPSG (boron phosphorus-doped silicon oxide), PSG (phosphorus-doped silicon oxide), USG (undoped silicate glass), TEOS (tetra ethyl ortho silicate), or FSG (fluorine-doped silicate glass), according to applications or embodiments thereof. The semiconductor substrate may be formed with any type of device, for example a transistor, a capacitor, etc., and at least one metal interconnection may be connected to the device (e.g., connected to the transistor or the capacitor).

A contact hole may be formed through interlayer dielectric layer 101, for example by performing a dry etching process, such as an RIE (reactive ion etching) process. A metal interconnection, which may be formed later (for example, through a later describe process), may be electrically connected to a transistor or capacitor provided at a lower portion of interlayer dielectric layer 101, for example by passing through the contact hole. The contact hole may include a via hole. Alternatively, the contact hole may include a via hole and a trench in communication with the via hole. At least one contact hole can be formed in interlayer dielectric layer 101.

Barrier metal layer 103 may be formed along an inner wall of the contact hole formed in interlayer dielectric layer 101. Barrier metal layer 103 may prevent copper (Cu) of the metal interconnection, which may be formed later (for example, through processes described herein below), from diffusing into interlayer dielectric layer 101 through the contact hole. That is, barrier metal layer 103 may serve as a diffusion barrier. Barrier metal layer 103 may be formed as a single layer or a multi-layer by using, for example, at least one material selected from Ta, TaN, TaAlN, TaSiN, Ti, TiN, WN, and TiSiN.

A copper metal layer including copper (Cu) may be deposited on interlayer dielectric layer 101 having the contact hole. The copper metal layer may be planarized, for example through a CMP (chemical mechanical polishing) process, thereby forming copper metal interconnection 105 in the contact hole. Thus, the copper metal layer may not exist on interlayer dielectric layer 101, and may not contact interlayer dielectric layer 101. The surface of barrier metal layer 103 may be positioned on the same plane or substantially the same plane as a surface of interlayer dielectric layer 101. During the planarization (e.g., the CMP process), interlayer dielectric layer 101 may be more polished than the copper metal layer aligned in the contact hole, and copper metal interconnection 105 aligned in the contact hole may protrude relative to interlayer dielectric layer 101. Accordingly, a stepped area may exist between a surface of copper metal interconnection 105 and a surface of interlayer dielectric layer 101. That is, a surface of copper metal interconnection 105 and a surface of interlayer dielectric layer 101 may not lie in the same plane.

If copper metal interconnection 105 (for example, created through the above process) is an uppermost copper metal interconnection of a semiconductor device, copper metal interconnection 105 may be connected to a metal pad, which may be formed later (for example, as described through embodiments of processes described below).

A metal pad may include aluminum-based metallic materials. This is because aluminum-based metallic materials exhibit good adhesive properties in a wire bonding process.

Figure 2B:
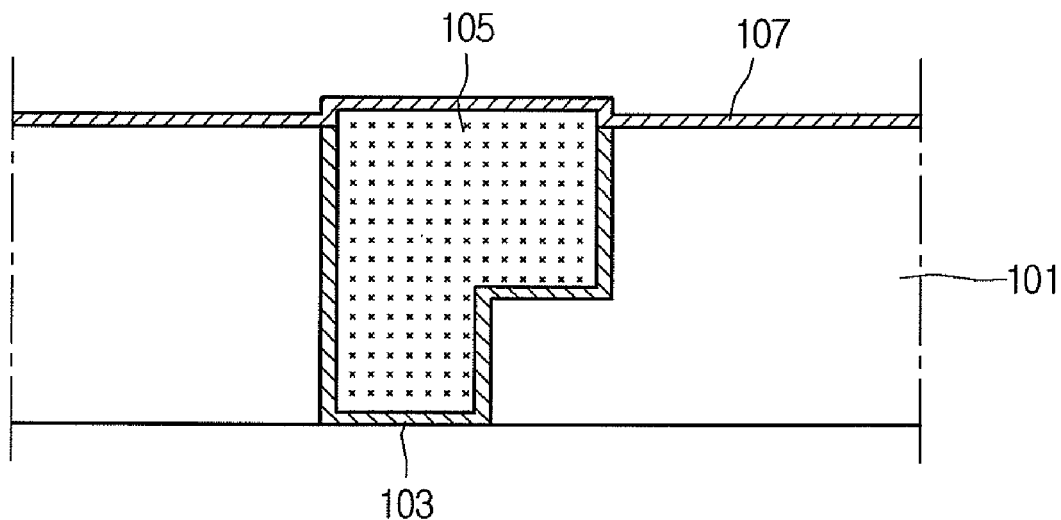

As illustrated in example FIG. 2B, first diffusion barrier 107 may be formed on interlayer dielectric layer 101, including copper metal interconnection 105, and may serve to prevent diffusion of copper contained in copper metal interconnection 105.

First diffusion barrier 107 may be provided through various processes. Two examples will be described.

First, according to embodiments, ruthenium (Ru) may be deposited on interlayer dielectric layer 101, for example through a sputtering process. A plasma treatment process may be performed, for example by using oxygen ($O_2$) or nitrogen oxide ($N_2O$) with respect to a surface of ruthenium deposited on interlayer dielectric layer 101. A dual layer of ruthenium/ruthenium oxide ($Ru/RuO_2$) may thus be formed. First diffusion barrier 107 may have a thickness in a range of approximately 100 Å to 1000 Å. Other thicknesses could also be achieved.

Alternatively, according to embodiments, ruthenium oxide ($RuO_2$) may be formed on interlayer dielectric layer 101, for example by performing an RF sputtering process using ruthenium (Ru), oxygen ($O_2$), or nitrogen oxide ($N_2O$). Since ruthenium oxide ($RuO_2$) has no specific directionality, it may effectively prevent copper diffusion.

Figure 2C:
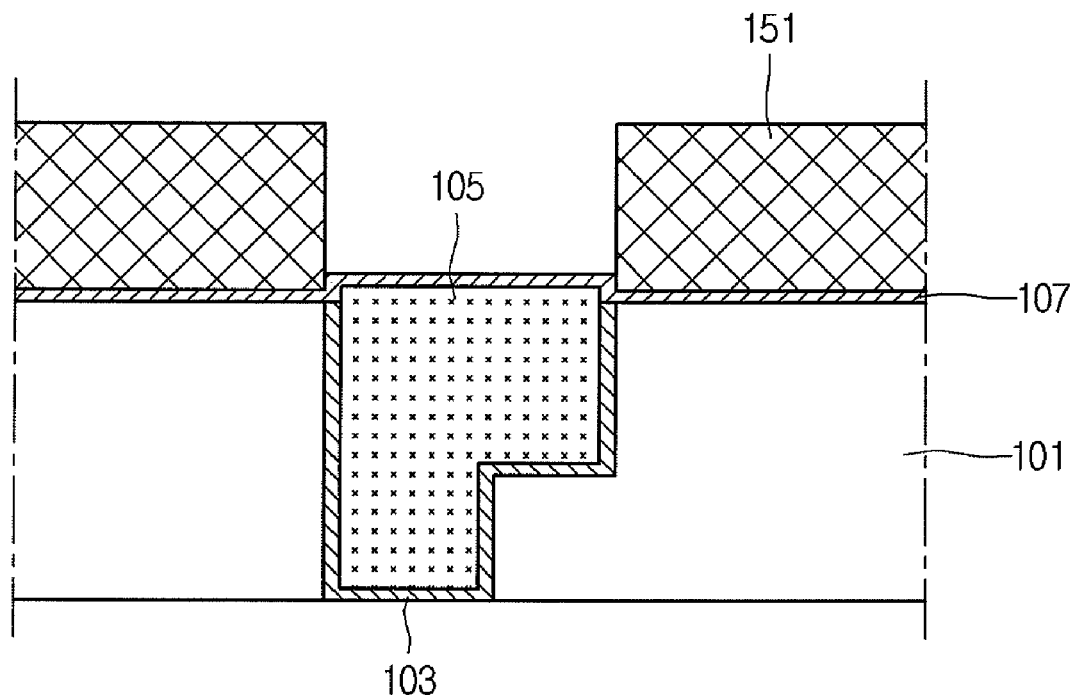

As illustrated in example FIG. 2C, first photoresist pattern 151 may be formed on first diffusion barrier 107. Photoresist may include a photo-sensitive material, synthetic resin forming a thin film, and solvent for dissolving the synthetic resin. The photoresist may be classified into positive photoresist and negative photoresist. In positive photoresists, a polymer may be divided into monomers by photons when light is incident into the photo-sensitive material so that the photo-sensitive material is changed into a material to be dissolved in a developing solution. In negative photoresist, the photo-sensitive material may be changed into an insoluble polymer that may not dissolve in the developing solution when light is incident into the photo-sensitive material.

First photoresist pattern 151 may be formed through a photolithography process. That is, after first diffusion barrier 107 has been coated with either positive photoresist or negative photoresist, an exposure and development process is performed with respect to the positive photoresist or negative photoresist. This may form first photoresist pattern 151. First photoresist pattern 151 may have open areas exposing at least a portion of first diffusion barrier 107. A width of the open area may be identical to a width of the contact hole.

Figure 2D:
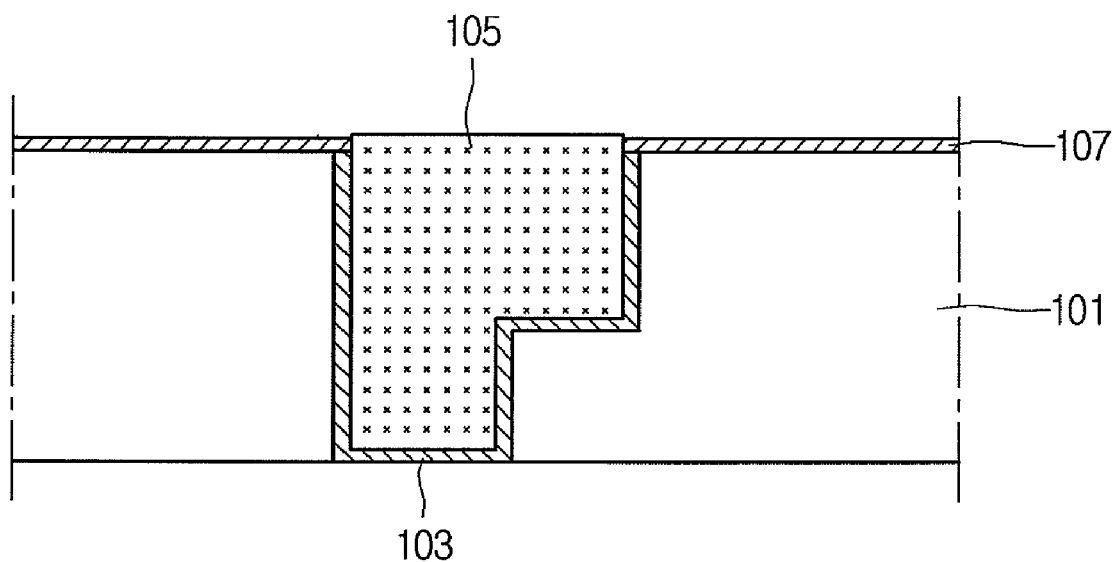

As illustrated in example FIG. 2D, first diffusion barrier 107 may be selectively etched by using first photoresist pattern 151 as an etch mask. An upper portion of copper metal interconnection 105 may thereby be exposed. First diffusion barrier 107 may extend in the lateral direction and may make contact with a lateral side of copper metal interconnection 105, for example at a location having a step difference relative to first diffusion barrier 107. Thus, copper of copper metal interconnection 105 may not diffuse in the lateral direction due to first diffusion barrier 107. First diffusion barrier 107 may be completely removed from copper metal interconnection 105. First photoresist pattern 151 may then be stripped.

Figure 2E:
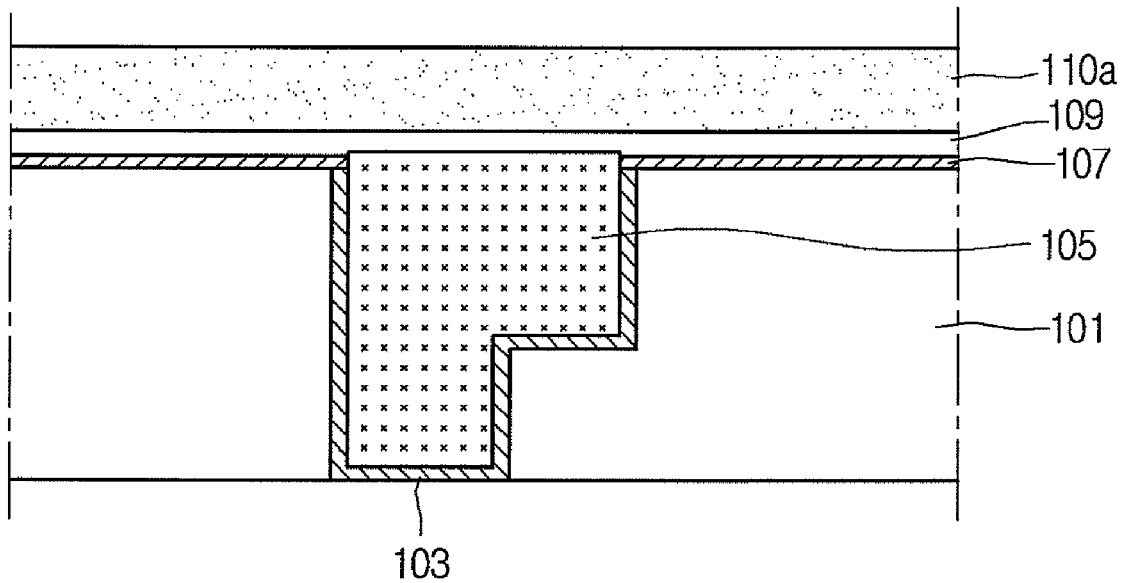

As illustrated in example FIG. 2E, second diffusion barrier 109 may be formed on first diffusion barrier 107 and copper metal interconnection 105. Second diffusion barrier 109 may be made from a material identical or substantially identical to, material forming first diffusion barrier 107, or may be made from a material different from a material forming first diffusion barrier 107.

If second diffusion barrier 109 is made from a material identical to (or substantially similar to) a material used to form first diffusion barrier 107, second diffusion barrier 109 may be provided according to the two the example processes described above.

For example, according to embodiments, ruthenium (Ru) may be deposited on interlayer dielectric layer 101, for example through a sputtering process. A plasma treatment process may be performed, for example by using oxygen ($O_2$) or nitrogen oxide ($N_2O$) with respect to a surface of ruthenium deposited on interlayer dielectric layer 101. A dual layer of ruthenium/ruthenium oxide ($Ru/RuO_2$) may thus be formed. First diffusion barrier 107 may have a thickness in a range of approximately 100 Å to 1000 Å. Other thicknesses could also be achieved.

Alternatively, according to embodiments, ruthenium oxide ($RuO_2$) may be formed on interlayer dielectric layer 101, for example by performing an RF sputtering process using ruthenium (Ru), oxygen (O₂), or nitrogen oxide (N₂O). Since ruthenium oxide (RuO₂) has no specific directionality, it may effectively prevent copper diffusion.

If second diffusion barrier 109 is made from a material different from a material used or form first diffusion barrier 107, second diffusion barrier 109 may be formed as a single layer or a multi-layer, for example by using at least one material selected from Ta, TaN, TaAlN, TaSiN, Ti, TiN, WN, and TiSiN.

Aluminum metal layer 110a may be formed on second diffusion barrier 109, for example through the PVD or CVD process including a sputtering or evaporation process. At this time, aluminum metal layer 110a may contain a small amount of copper (Cu). A second photoresist pattern (not shown) having a predetermined open area may be formed on aluminum metal layer 110a.

Figure 2F:
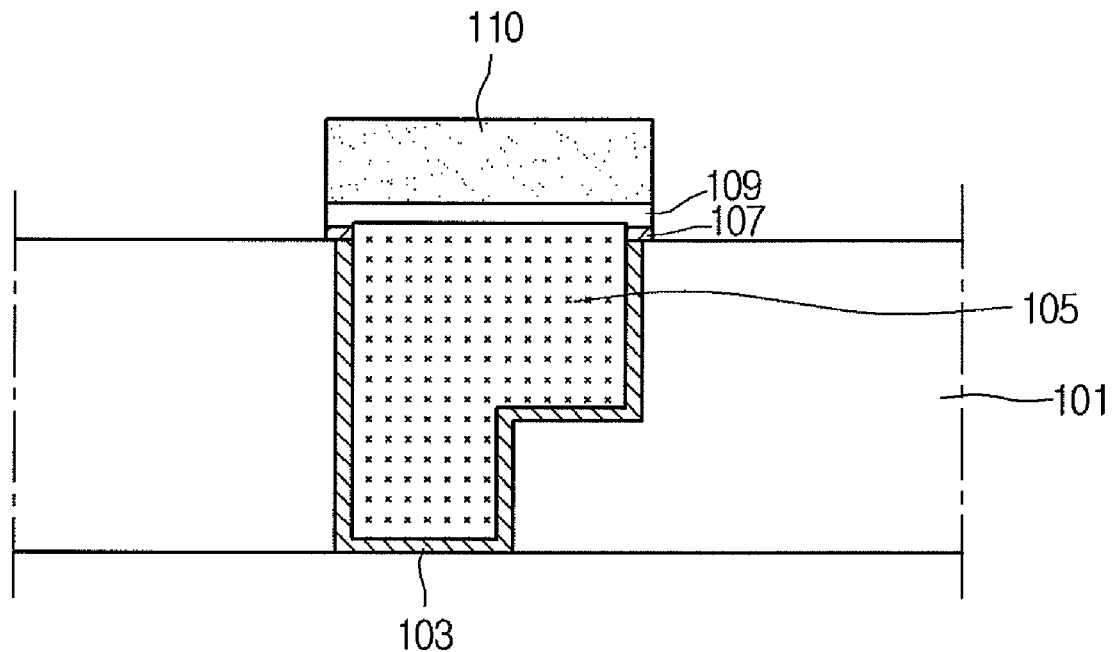

As illustrated in example FIG. 2F, a RIE (reactive ion etching) process may be performed, for example by using the second photoresist pattern as an etch mask. Thus, aluminum metal layer 110a, second diffusion barrier 109, and first diffusion barrier 107 may be sequentially etched, to form metal pad 110. A width of the open area may be a larger than the width of the contact hole. If the width of the open area is larger than the width of the contact hole, first diffusion barrier 107 may remain at a side of a step difference part of copper metal interconnection 105 during the etching process. Copper contained in copper metal interconnection 105 may be prevented from diffusing in the lateral direction by first diffusion barrier 107.

Since second diffusion barrier 109 may be formed on copper metal interconnection 105 and first diffusion barrier 107 may be formed at a lateral side of copper metal interconnection 105, copper contained in copper metal interconnection 105 may be prevented from diffusing in an upward or lateral direction. That is, copper contained in copper metal interconnection 105 may not diffuse into metal pad 110. Quality of metal pad 110 may thereby be improved.

Metal pad 110 may be formed as a single layer or a multi-layer. Metal pad 110 may be used as a bonding pad, for example for wire bonding.

Figure 2G:
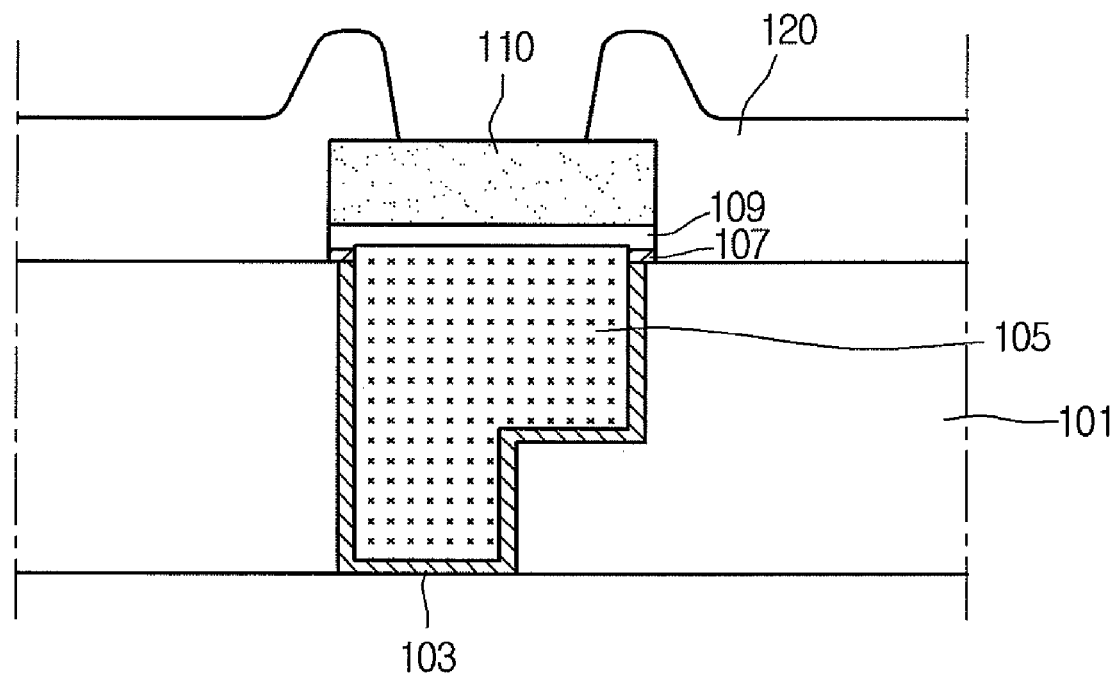

As illustrated in example FIG. 2G, protective layer 120 may be formed on metal pad 110, and protective layer 120 may be selectively etched so that metal pad 110 may be partially exposed.

Protective layer 120, which may protect metal pad 110 (e.g., an insulating layer such as a silicon oxide layer or a silicon nitride layer) may be formed on the substrate including metal pad 110 (for example, through a CVD process or a spin-on coating process). A polyimide layer may be further formed on the insulating layer. A dry etching process may be performed, for example by using the photoresist pattern as an etch mask. Part of protective layer 120 formed on metal pad 110 may thus be removed.

Open areas that expose portions of metal pad 110 may be formed. Due to the open areas, metal pad 110 may be electrically connected to a device, for example the package, by wire bonding or any other method of electrical connection.

According to embodiments, first and second diffusion barriers 107 and 109 may be formed at the lateral side and the upper surface of the uppermost copper metal interconnection 105. Copper contained in copper metal interconnection 105 may thus be prevented from diffusing in the upward or lateral direction. It may therefore be possible to provide metal pad 110 having a high quality, and wire bonding may be readily performed. Reliability of a semiconductor device may thereby be improved.

It will be apparent to those skilled in the art that various modifications and variations can be made to embodiments. Thus, it is intended that embodiments cover modifications and variations thereof within the scope of the appended claims.

What is claimed is:

1. A device comprising:
   an insulating layer formed over a substrate, the insulating layer having a hole;
   a metal interconnection formed in the hole and protruding in a direction relative to the insulating layer;
   a first barrier formed over the insulating layer and extending in a lateral direction relative to the metal interconnection;
   a second barrier formed over at least the metal interconnection and the first barrier; and
   a metal pad formed over the second barrier,
   wherein the first barrier and the second barrier each directly contact the metal interconnection.

2. The device of claim 1, wherein the hole comprises a via hole.

3. The device of claim 1, wherein the hole comprises a via hole and a trench communicatively coupled with the via hole.

4. The device of claim 1, wherein the metal interconnection comprises copper.

5. The device of claim 1, wherein the metal interconnection comprises aluminum.

6. The device of claim 1, wherein the first barrier has a thickness in a range of approximately 100 Å to 1000 Å.

7. The device of claim 1, further comprising a third barrier formed at a lower portion of the metal Interconnection.

8. The device of claim 7, wherein the third barrier comprises at least one of Ta, TaN, TaAlN, TaSiN, Ti, TiN, WN, and TiSiN.

9. The device of claim 7, wherein the third barrier comprises one of a single layer barrier and a multi-layer barrier.

10. The device of claim 1, wherein the first barrier comprises a material substantially identical to a material forming the second barrier.

11. The device of claim 10, wherein the first and second barriers each comprise a single layer of ruthenium oxide (RuO₂).

12. The device of claim 10, wherein the first and second barriers each comprise a dual layer of ruthenium/ruthenium oxide (Ru/RuO₂).

13. The device of claim 1, wherein the first barrier comprises a material different than a material forming the second barrier.

14. The device of claim 13, wherein the first barrier comprises a single layer of ruthenium oxide (RuO₂).

15. The device of claim 13, wherein the first barrier comprises a dual layer of ruthenium/ruthenium oxide (Ru/RuO₂).

16. The device of claim 13, wherein the second barrier comprises at least one of Ta, TaN, TaAlN, TaSiN, Ti, TiN, WN, and TiSiN.

17. A method comprising:
   forming an insulating layer having at least one hole over a substrate;
   forming a metal interconnection in the at least one hole such that the metal interconnection protrudes relative to the insulating layer;
   forming a first barrier over the substrate and patterning the first barrier to expose at least a portion of the metal interconnection formed in the at least one hole; and
   forming a second barrier and an aluminum metal layer over the substrate and patterning the second barrier and the aluminum metal layer, to form a metal pad.

18. The method of claim 17, wherein the first barrier extends in a lateral direction relative to the metal interconnection.

19. The method of claim 17, wherein the metal pad is formed by sequentially etching the aluminum metal layer, the second barrier, and the first barrier.

20. The method of claim 17, wherein forming the first barrier comprises:
   forming a ruthenium (Ru) layer over the substrate; and
   treating the ruthenium layer with plasma to form a ruthenium oxide ($RuO_2$) layer over a surface of the ruthenium layer.

21. The method of claim 20, wherein the ruthenium layer is formed through a sputtering process.

22. The method of claim 20, wherein plasma gas used for treating the ruthenium layer comprises at least one of oxygen ($O_2$) and nitrogen oxide ($N_2O$).

23. The method of claim 17, wherein the first barrier comprises a ruthenium oxide ($RuO_2$) layer formed by performing a sputtering process using ruthenium (Ru) and plasma gas.

24. The method of claim 23, wherein the plasma comprises at least one of oxygen ($O_2$) and nitrogen oxide ($N_2O$).

25. A device comprising:
   an insulating layer formed over a substrate, the insulating layer having a hole;
   a barrier metal layer formed in the hole;
   a metal interconnection formed in the hole over and contacting the barrier metal layer and protruding from the insulating layer to form a pair of stepped areas with the uppermost surface of the insulating layer;
   a first barrier formed to contact an uppermost surface of the barrier metal layer and adjacent to and contacting the metal interconnection at the stepped areas;
   a second barrier formed over and contacting the metal interconnection and the first barrier; and
   a metal pad formed over and contacting the second barrier.

* * * * *